United States Patent
Rankin et al.

(10) Patent No.: US 6,680,629 B2
(45) Date of Patent: Jan. 20, 2004

(54) 5 V TOLERANT HOT CARRIER INJECTION (HCI) PROTECTION CIRCUIT

(75) Inventors: Andrew M. Rankin, Fort Collins, CO (US); Jason Hoff, Madison, WI (US); Ken Szajda, Holliston, MA (US)

(73) Assignee: LSI Logic Corporation, Milpitas, CA (US)

( * ) Notice: Subject to any disclaimer, the term of this patent is extended or adjusted under 35 U.S.C. 154(b) by 24 days.

(21) Appl. No.: 10/026,154

(22) Filed: Dec. 18, 2001

(65) Prior Publication Data

US 2003/0112039 A1 Jun. 19, 2003

(51) Int. Cl.[7] .............................. H03B 1/00; H03B 3/00
(52) U.S. Cl. ..................... 327/108; 327/112; 326/27; 326/82; 326/83
(58) Field of Search ................................ 327/108, 110, 327/112; 326/23, 24, 26, 27, 62, 80–83, 86, 87

(56) References Cited

U.S. PATENT DOCUMENTS

| | | | | |
|---|---|---|---|---|
| 5,153,450 A | * | 10/1992 | Ruetz | 326/87 |
| 5,166,555 A | * | 11/1992 | Kano | 326/87 |
| 5,170,073 A | * | 12/1992 | Hahn et al. | 327/108 |
| 5,483,188 A | * | 1/1996 | Frodsham | 327/170 |
| 5,825,219 A | * | 10/1998 | Tsai | 327/112 |
| 6,021,071 A | * | 2/2000 | Otsuka | 365/189.05 |
| 6,327,195 B2 | * | 12/2001 | Tomishima et al. | 365/189.11 |
| 6,359,478 B1 | * | 3/2002 | Chow | 327/112 |
| 6,445,222 B1 | * | 9/2002 | Hidaka et al. | 327/108 |
| 6,529,056 B1 | * | 3/2003 | You et al. | 327/170 |

* cited by examiner

*Primary Examiner*—Tuan T. Lam
(74) *Attorney, Agent, or Firm*—William W. Cochran LLC

(57) ABSTRACT

A long channel transistor and a shorter channel transistor operate in conjunction to drive an output node. The long channel device is first activated by a drive signal and the drive signal is input to a delay element that then activates the shorter channel device. By enabling the long channel device first, hot carrier injection effects are reduced. Employing two transistors that are sized to operate in different voltage ranges reduces surge current. The two-transistor configuration of the present invention occupies less area than a single long channel device with similar drive capabilities.

6 Claims, 4 Drawing Sheets

US 6,680,629 B2

5 V TOLERANT HOT CARRIER INJECTION (HCI) PROTECTION CIRCUIT

BACKGROUND OF THE INVENTION a. Field of the Invention

The present invention relates to semiconductor devices and, more particularly, to a method and circuit for increased device reliability through protection against the effects of hot carriers.

b. Description of the Background

Advances in the semiconductor industry continue to provide smaller device geometries. As geometries have been reduced, some failure mechanisms have become more pronounced. One of the most significant contributors to device failure in sub-micron range devices is hot carrier injection (HCI), also referred to as hot carrier effect. Hot carrier injection is an effect where high-energy charges are injected into the gate dielectric of a MOSFET device and may become lodged in the dielectric. Trapped charges tend to accumulate over time and affect the turn-on voltage, and drain current of transistors and may eventually lead to the failure of the device. Carrier injection is a function of field strength between the source and drain of a transistor. Field strength is a function of the physical distance and voltage difference between source and drain channels. The reduction in geometries of semiconductor devices has been accompanied by a reduction in the operating voltage of the device. Many logic devices that operated at 5 volts a number of years ago now operate at 3.3 volts or less.

Many devices have input/output buffers that meet TTL specifications. However, many of these devices generate an output voltage level that is close to the positive supply voltage when generating a logic one voltage. When a device having a 5 volt supply is interfaced with a device having a 3.3 volt power, a voltage near 5 volts may be presented to the 3.3 volt device as a logic one level. The input structure of the 3.3 volt device may employ diodes to accommodate the 5 volt level. Output drivers for a 3.3 volt device, and more specifically n-channel devices employed to drive a logic zero value, however, may experience a voltage difference near 5 volts. This higher voltage results in higher field strength for n-channel devices and may result in higher HCI rates and reduced device reliability.

One approach to reducing HCI effects is to employ longer channel transistors. A longer channel device must be wider in order to provide the same current capabilities as a shorter channel device, resulting in greater area being employed for the drive transistors and higher cost for the device. A new method is needed that provides the reduced HCI susceptibility of longer channel devices but without the area and cost penalties of longer devices.

SUMMARY OF THE INVENTION

The present invention overcomes the disadvantages and limitations of the prior art by first employing a long channel transistor to discharge a signal node to a voltage level at which shorter channel devices may be enabled. This provides lower field strength across the short channel device, reducing charges deposited in the dielectric layer. The long channel transistor is less susceptible to HCI damage such that the long and short channel transistor combination provides higher device reliability.

The invention therefore may comprise a high reliability output driver comprising: a first transistor having a first gate channel length, the first transistor being operatively connected between an output node and a first voltage terminal, a second transistor having a second gate channel length wherein the second gate channel length is greater than the first gate channel length, the second transistor being operatively connected between the output node and the first voltage terminal, a drive signal line connected to the gate of the first transistor, and a delay element having an input connected to the drive signal line and an output connected to the gate of the second transistor.

The present invention employs a long channel device that is designed to operate across a first voltage range, such as zero volts to 5.25 volts, for example, and employs a short channel transistor that is designed to operate at a second voltage range, such as zero volts to 3.5 volts, for example. The two-transistor architecture of the present invention may be employed to charge or discharge a signal node with lower surge current than may be exhibited by a single transistor. The method of the present invention is applicable to external driver circuitry and to internal circuitry where different voltage levels may be encountered.

The invention may further comprise a method for increased reliability in a semiconductor driver comprising: connecting a first transistor between a voltage terminal and an output node, connecting a second transistor between the voltage terminal and the output node wherein the second transistor has a gate channel length that is less than the gate channel length of the first transistor, applying a first gating signal to the gate of the first transistor, applying the first gating signal to the input of a delay element to generate a delayed output, and applying the delayed output to the gate of the second transistor.

Advantageously, the present invention provides higher reliability and desirable drive characteristics without incurring the space and cost penalties of large long channel devices.

DESCRIPTION OF THE FIGURES

In the figures.

DETAILED DESCRIPTION OF THE INVENTION

Hot carrier degradation is a key reliability issue prominent in deep submicrometer MOSFET's. The degradation results from a buildup of charge near the drain junction of a transistor that results in threshold voltage shift, transconductance degradation, and drain current reduction, and may eventually lead to device failure.

Figure 1:
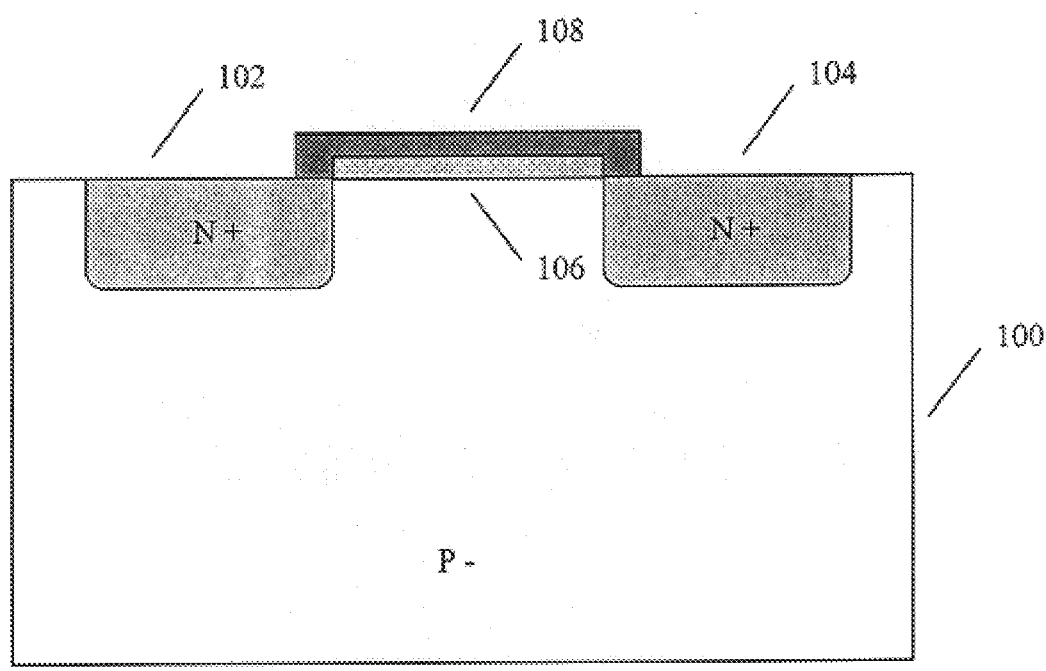
FIG. 1 depicts an n-channel transistor.

FIG. 1 depicts an n-channel transistor. Substrate 100 is lightly positively doped. Disposed in substrate 100 are source channel 102 and drain channel 104 which comprise a strongly negatively doped material. A thin oxide region 106 is formed near the surface of the substrate between source channel 102 and drain channel 104 and serves as a gate dielectric. A gate material 108 is co-planarly disposed on top of thin oxide region 106. If a positive voltage is applied to source channel 102 and drain channel 104 is connected to ground, a positive voltage may be applied to gate material 108 such that a depletion region forms under thin oxide region 106 and current may flow.

Figure 2A:
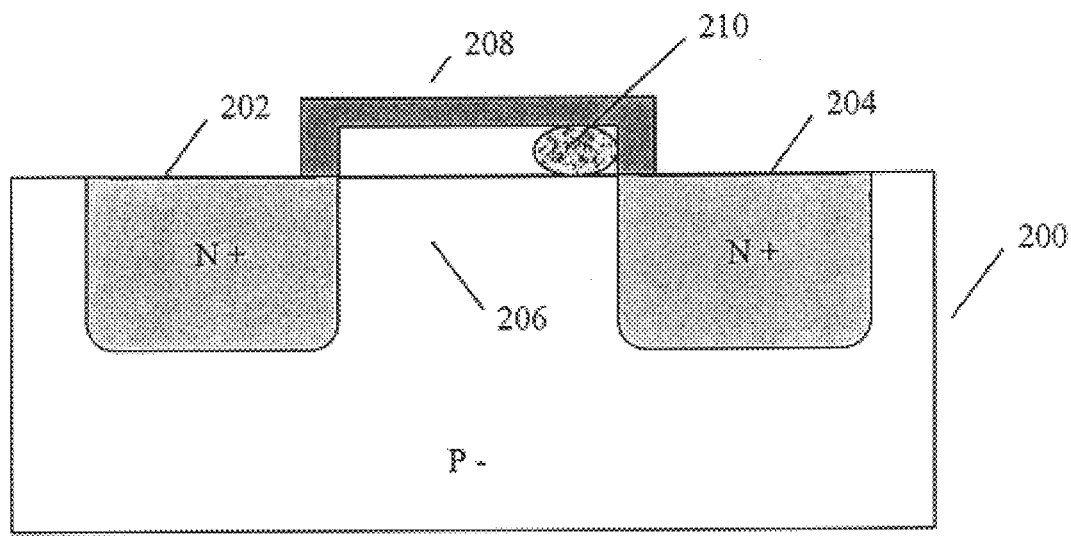
FIG. 2A depicts an n-channel transistor with HCI charge accumulation.
Figure 2B:
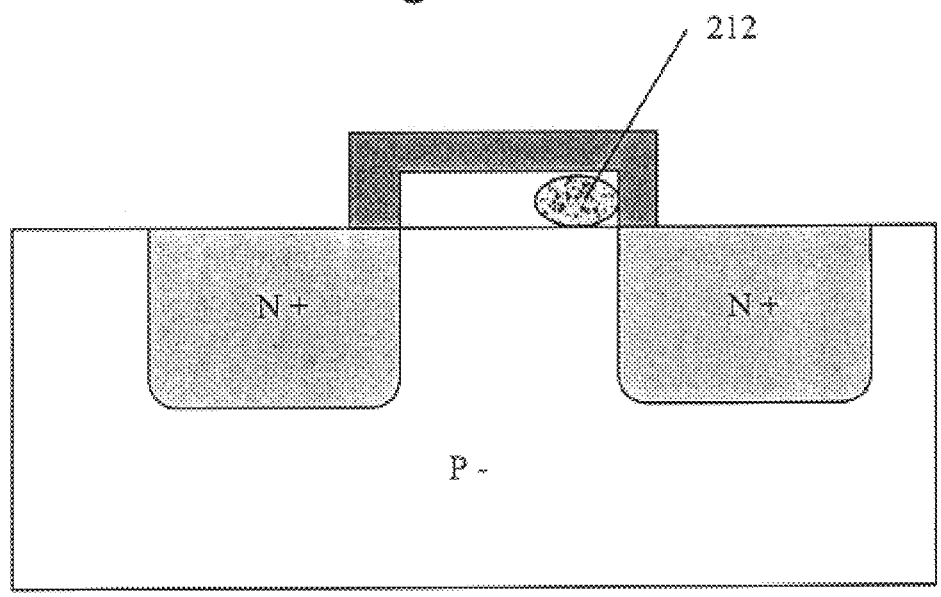
FIG. 2B illustrates that the trapped charge area does not scale with transistor channel length.

FIG. 2A depicts an n-channel transistor with HCI charge accumulation. Substrate 200 contains source channel 202 and drain channel 204. Gate material 208 is co-planarly disposed above thin oxide region 206. Within thin oxide region 206, and in proximity to drain channel 204, trapped charge area 210 illustrates the manner in which charges may accumulate in the thin oxide region. FIG. 2B illustrates that the trapped charge area 212 does not scale with transistor channel length. In other words, the trapped charge area is approximately the same size for a value of field strength. In a shorter channel length transistor, the trapped charge area occupies a larger portion of the channel between source and drain, resulting in a higher probability of device degradation and device failure. Transistors depicted in FIGS. 1, 2A, and 2B are intended to illustrate the nature of hot carrier injection and may not reflect the scale or physical positioning of elements for any particular semiconductor process.

Figure 3A:
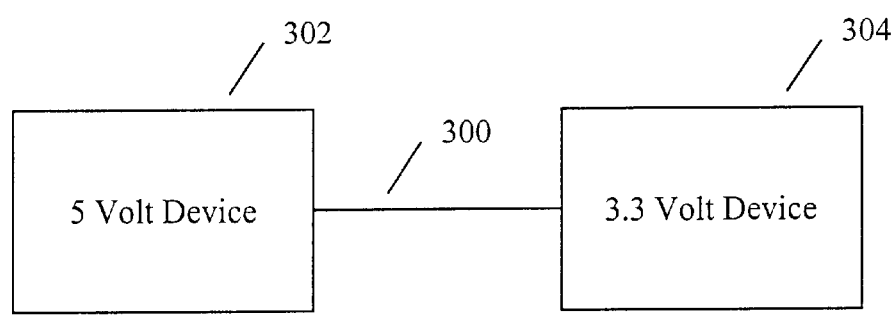
FIG. 3A depicts interconnection between a 5 volt device and a 3.3 volt device.
Figure 3B:
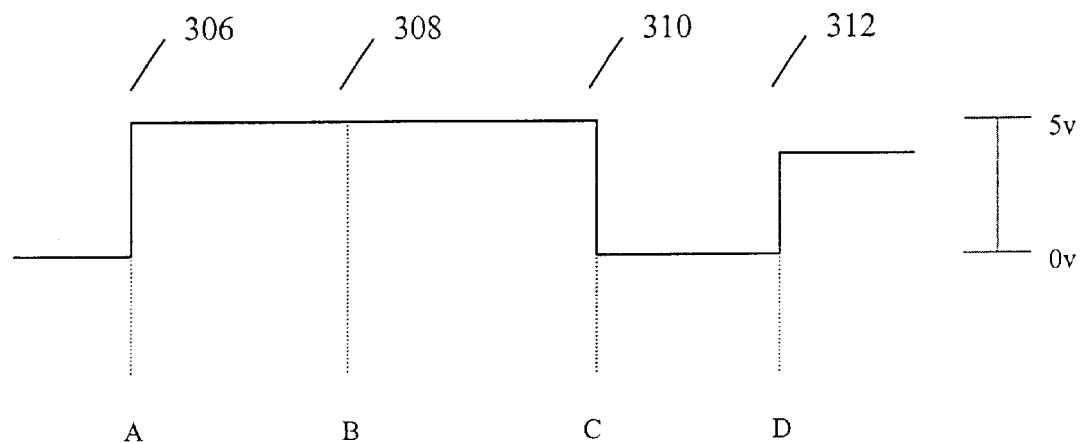
FIG. 3B provides an example signal sequence for a signal line interfacing a 5-volt device and a 3.3-volt device.

As device geometries have grown smaller, the operating voltage of devices has been reduced. The industry has seen voltage drop from 5 volts, to 3.3 volts, and shall likely see further reductions in voltage. A potential problem may occur when devices operating at different voltages are interfaced. FIG. 3A depicts interconnection between a 5-volt device and a 3.3-volt device. Signal line 300 connects 5-volt device 302 with 3.3-volt device 304. Signal line 300 may be bi-directional and may be driven at some periods of time by 5-volt device 302 and maybe driven at other periods of time by 3.3-volt device 304. In a bi-directional interface, there are typically periods of time between when 5-volt device 302 or 3.3-volt device 304 drive signal line 300 such that signal line 300 is 30 allowed to 'float' wherein drive signals from both 5-volt device 302 and 3.3-volt device 304 are in a high impedance state. Many devices conform to TTL input and output voltage level specifications wherein a logical 1 may be represented by a voltage level of not less than 2.7 volts. However, it is often the practice to produce a logic one level that is equal to or near to the positive supply voltage of the device. As such, this may result in a logic one level being driven as 3.3 volts or 5 volts depending on the operating voltage of the device. FIG. 3B provides an example signal sequence for a signal line interfacing a 5-volt device and a 3.3-volt device. At time A (ref 306), 5-volt device 302 drives signal line 300 to five volts. At time B (ref 308), the output driver of 5-volt device 302 is placed in a high impedance state and signal line 300 is allowed to float. Signal line 300 may remain at approximately 5 volts between time B (ref 308) and time C (ref 310) due to line capacitance and high impedance of input/output buffers. At time C (ref 310), 3.3-volt device 304 drives signal line 300 to a logic zero. When 3.3-volt device 304 first begins to drive signal line 300, signal line 300 is at approximately five volts. This results in the output buffers of 3.3-volt device 304 being subjected to high field strength for a period of time until signal line 300 is discharged to a lower voltage. The high field strength during this period of time results in a higher rate of charge accumulation in the gate dielectric of the output driver of 3.3-volt device 304. This results in a higher rate of degradation and earlier potential failure of the device. In CMOS devices, n-channel transistors that are employed to discharge signal nodes may exhibit the greatest degradation from HCI. In order to address HCI reliability issues, a designer may elect to employ longer channel devices for output driver circuitry. The longer channel devices employed for driver circuitry would also require a wider channel to provide the same drive as shorter channel devices. While the longer channel devices offer increased reliability, they may also result in circuit cost due to larger circuit area.

Figure 4:
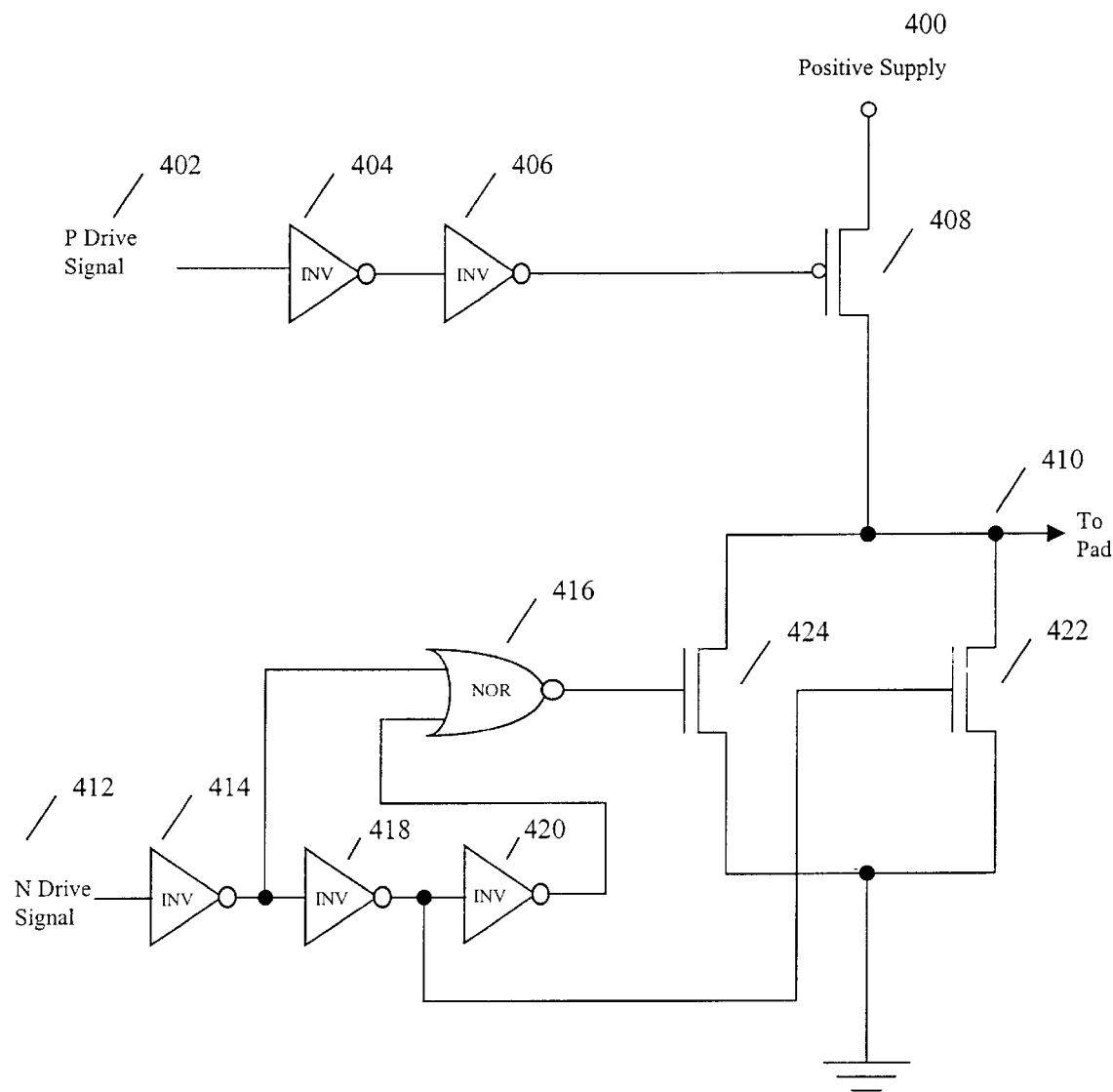
FIG. 4 depicts a circuit embodiment of the present invention.

FIG. 4 depicts a circuit embodiment of the present invention. Positive supply 400 is coupled to p-channel transistor 408. P drive signal 402 is input to inverter 404. The output from inverter 404 is input to inverter 406. The output of inverter 406 is coupled to the gate of p-channel transistor 408. P-channel transistor 408 is coupled to output node 410 that may be connected to an output pad. Output node 410 is also coupled to first n-channel transistor 422 and second n-channel transistor 424. The channel length of first n-channel transistor 422 is greater than that of second n-channel transistor 424. N drive signal 412 is input to inverter 414. The output of inverter 414 is coupled to the input of inverter 418 and to a first input of two-input NOR 416. The output of inverter 418 is coupled to the input of inverter 420 and to the gate of first n-channel transistor 422. The output of inverter 420 is coupled to a second input of two-input NOR 416. The output of two-input NOR 416 is coupled to the gate of second n-channel transistor 424.

Operationally, P drive signal 402 may be asserted and the signal propagated through inverter 404 and through inverter 406 to the gate of p-channel transistor 408, enabling current to pass through p-channel transistor 408 to charge output node 410. To discharge output node 410, the N drive signal 412 is asserted and the signal propagates through inverter 414 and to a first input of two-input NOR 416 and to the input of inverter 418. The second input of two-input NOR 416 remains at a logic 1 level until the asserted N drive signal propagates through inverter 418 and inverter 420. First n-channel 422 is enabled as the asserted N drive signal propagates through inverter 418 and to the gate of first n-channel transistor 422. After a delay comprising the propagation delay through inverter 420 and two-input NOR 416, second n-channel transistor 424 is enabled. In this manner, the long channel n-channel transistor is turned on first, allowing discharge of the output node and reduction of voltage prior to the time at which the shorter channel transistor is enabled. This results in higher reliability while occupying less circuit area than a single wider transistor with a long channel.

The present invention also may provide less spiking due to current surges when discharging a node. This is a result of sizing the long channel device to reflect desired current flow when the output node voltage is between 5 volts and 3.3 volts, and sizing the short channel transistor to reflect desired current flow when the output node voltage is equal to 3.3 volts. This is in contrast to a single device, either short or long channel, that is sized to produce the desired current flow when the output node voltage equal to 3.3 volts and therefore transfers much more current when the output node voltage is higher than 3.3 volts, since the current through the device varies with the square of the difference between turn-on voltage and gate to source voltage.

The present invention provides an efficient and economical solution to HCI effects and provides reduced surge current, reducing EMI radiation and coupled noise. While 5 volts and 3.3 volts have been used for purposes of illustration, the present invention is not constrained to any voltage ranges or specific electronics technologies or fabrication methods. The foregoing description employs inverters and a NOR gate to implement a delay element to delay activation of the short channel transistor. Other delay element implementations, such as inverter chains, RC delays, and other delay techniques known in the semiconductor and circuit arts may be employed within the scope of the present invention. The term channel length has been employed to refer to the length of the gate channel of a transistor. The present invention is well suited to output buffer driver circuitry but also may be employed in internal circuitry where sections operating at different voltages, such as may be found in memory or other devices, are interfaced.

The foregoing description of the invention has been presented for purposes of illustration and description. It is not intended to be exhaustive or to limit the invention to the precise form disclosed, and other modifications and variations may be possible in light in the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A high reliability output driver that provides reduced susceptibility to hot carrier injection damage comprising:
    an input node;
    an output node;
    a first transistor having a first gate channel length, said first transistor connected between said output node and a first voltage terminal;
    a second transistor having a second gate channel length that is less than said first gate channel length, said second transistor connected between said output node and said first voltage terminal;
    a drive signal line connected to said input node and to the gate of said first transistor;
    a delay element having an input connected to said drive signal line and an output connected to the gate of said second transistor that delays the activation of said second transistor such that the voltage difference between said output node and said first voltage terminal is reduced by said first transistor prior to the activation of said second transistor and hot carrier injection effects in said second transistor are reduced; and
    a third transistor operatively connected between said output node and a second voltage terminal.

2. The high reliability output driver of claim 1 wherein said third transistor is a p-channel device.

3. The high reliability output driver of claim 2 wherein said drive signal line is connected only to said delay element, said delay element providing a first output connected to said gate of said first transistor and a second output connected to said gate of said second transistor, wherein said delay element further comprises:
    a first inverter having an input and an output, the input to said first inverter connected to said drive signal line;
    a second inverter having an input and an output, said input of said second inverter coupled to the output of said first inverter and said output of said second inverter connected to said gate of said first transistor;
    a third inverter having an input and an output, said input of said third inverter connected to the output of said second inverter;
    a two input NOR gate having a first input coupled to said output of said first inverter and a second input coupled to said output of said third inverter, the output of said NOR gate being connected to said gate of said second transistor.

4. A method of driving an output node in a semiconductor device that provides reduced susceptibility to hot carrier injection and increased reliability in said semiconductor device, said method comprising:
    connecting a first transistor having a first gate channel length between a voltage terminal and an output node;
    connecting a second transistor that has a gate channel length less than said first gate channel length between said voltage terminal and said output node;
    connecting an input signal line to the gate of said first transistor and to the input of a delay element;
    connecting the output of said delay element to the gate of said second transistor;
    applying a voltage to said input signal line such that said first transistor is activated for a period of time determined by said delay element prior to the time that said second transistor is activated such that the voltage difference between said output node and said voltage terminal is reduced by said first transistor prior to the activation of said second transistor and hot carrier injection effects in said second transistor are reduced; and
    connecting a third transistor between said output node and a second voltage terminal.

5. The method claim 4 wherein said third transistor is a p-channel device.

6. The method of claim 4 wherein said steps of connecting an input signal line to the gate of said first transistor and to the input of a delay element and connecting the output of said delay element to the gate of said second transistor further comprise:
    connecting said input signal line to the input of a first inverter having an input and an output;
    connecting said output of said first inverter to a second inverter having an input and an output;
    connecting said output of said second inverter to said gate of said first transistor and to the input of a third inverter having an input and an output;
    connecting said output of said first inverter to a first input of a two input NOR gate and connecting said output of said third inverter to a second input of said NOR gate; and
    connecting the output of said two input NOR gate to said second transistor.

* * * * *